(12) United States Patent
Kanike (10) Patent No.: US 9,012,283 B2
(45) Date of Patent: Apr. 21, 2015

(54) INTEGRATED CIRCUIT (IC) CHIP HAVING BOTH METAL AND SILICON GATE FIELD EFFECT TRANSISTORS (FETS) AND METHOD OF MANUFACTURE

(75) Inventor: Narasimhulu Kanike, Wayne, NJ (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 13/108,213

(22) Filed: May 16, 2011

(65) Prior Publication Data

US 2012/0292664 A1 Nov. 22, 2012

(51) Int. Cl.
*H01L 21/8234* (2006.01)
*H01L 27/12* (2006.01)
*H01L 21/84* (2006.01)
*H01L 27/092* (2006.01)
*H01L 27/06* (2006.01)
*H01L 21/8238* (2006.01)

(52) U.S. Cl.
CPC ...... *H01L 21/82345* (2013.01); *H01L 27/1203* (2013.01); *H01L 21/84* (2013.01); *H01L 27/0922* (2013.01); *H01L 27/0629* (2013.01); *H01L 21/823842* (2013.01)

(58) Field of Classification Search
CPC ............................... H01L 29/66545
USPC ................... 438/275, 630; 257/529
See application file for complete search history.

(56) References Cited

U.S. PATENT DOCUMENTS

| | | | |
|---|---|---|---|
| 5,780,912 A | 7/1998 | Burr et al. | |
| 5,856,225 A * | 1/1999 | Lee et al. | 438/291 |
| 6,096,611 A | 8/2000 | Wu | |
| 6,265,293 B1 * | 7/2001 | Yu | 438/528 |
| 6,369,606 B1 | 4/2002 | Houghton et al. | |
| 7,091,118 B1 | 8/2006 | Pan et al. | |
| 7,304,353 B2 | 12/2007 | Helm et al. | |
| 7,439,140 B2 | 10/2008 | Helm et al. | |
| 7,696,579 B2 | 4/2010 | Helm et al. | |
| 7,755,146 B2 | 7/2010 | Helm et al. | |
| 8,119,461 B2 * | 2/2012 | Trentzsch et al. | 438/143 |
| 2006/0267137 A1 * | 11/2006 | Gambino et al. | 257/529 |
| 2007/0075351 A1 * | 4/2007 | Schulz et al. | 257/314 |
| 2010/0039852 A1 * | 2/2010 | Luk et al. | 365/149 |
| 2010/0044800 A1 | 2/2010 | Tseng et al. | |

* cited by examiner

*Primary Examiner* — Yu-Hsi D Sun
(74) *Attorney, Agent, or Firm* — Law Office of Charles W. Peterson, Jr.; H. Daniel Schnurmann (57) ABSTRACT

Field Effect Transistors (FETs), Integrated Circuit (IC) chips including the FETs, and a method of forming the FETs on ICs. FET locations are defined on a layered semiconductor wafer, preferably a Silicon On Insulator (SOI) wafer. One or more FET locations are defined as silicon gate locations and remaining as Replacement Metal Gate (RMG) FET locations with at least one of each on the IC. Polysilicon gates are formed in all FET locations. Gates in silicon gate locations are tailored, e.g., doped and silicided. Remaining polysilicon gates are replaced with metal in RMG FET locations. FETs are connected together into circuits with RMG FETs being connected to silicon gate FETs.

19 Claims, 12 Drawing Sheets

INTEGRATED CIRCUIT (IC) CHIP HAVING BOTH METAL AND SILICON GATE FIELD EFFECT TRANSISTORS (FETS) AND METHOD OF MANUFACTURE

BACKGROUND OF THE INVENTION

1. Field of the Invention

The present invention generally relates to Integrated Circuit (IC) manufacture and more particularly to reducing costs in semiconductor chip manufacture of integrated circuits with short channel Field Effect Transistors (FETs).

2. Background Description

Semiconductor technology and chip manufacturing advances have resulted in a steady decrease of chip feature size to increase on-chip circuit switching frequency (circuit performance) and the number of transistors (circuit density). Shrinking/reducing device or field effect transistor (FET) feature sizes and, correspondingly, device minimum dimensions including horizontal dimensions (e.g., minimum channel length) and vertical dimensions (e.g., channel layer depth, gate dielectric thickness, junction depths and etc.) shrinks device size for increased device density and device performance, as well as reduces device operating conditions, i.e., chip and correspondingly, device supply voltages and voltage swings.

Generally, all other factors being constant, the active power consumed by a given unit increases linearly with switching frequency, i.e., performance. Thus, notwithstanding the decrease of chip supply voltage, chip power consumption has increased as well. Both at the chip and system levels, cooling and packaging costs have escalated as a natural result of this increase in chip power. Especially for low end systems (e.g., handhelds, portable and mobile systems), where battery life is crucial, reducing net power consumption is important. However, such a power reduction must come without degrading chip/circuit performance below acceptable levels.

To minimize semiconductor circuit power consumption, most Integrated Circuits (ICs) are made in the well-known complementary insulated gate FET technology known as CMOS. Moreover, state of the art CMOS chips are frequently made in a silicon on insulator (SOI) technology, where CMOS devices are formed in a thin uniform silicon surface layer. Whether on a bulk wafer or in SOI, typical CMOS circuit includes paired complementary devices, i.e., an n-type FET (NFET) paired with a corresponding p-type FET (PFET), usually gated by the same signal.

In an ideal NFET, for example, current only flows when the gate to source voltage ($V_{gs}$) exceeds the device threshold voltage ($V_T$) and is determined in part by the amount which it exceeds $V_T$, i.e., by $V_{gs}-V_T$. PFETs operate analogously. FET drain to source current ($I_{ds}$, which is considered DC current and so, DC power ($I_{ds}V_{supply}$) consumed) is dependent upon circuit conditions, device characteristics (e.g., width, length, channel mobility and threshold voltage) and device voltages.

Since the pair of devices in an ideal inverter have operating characteristics that are, essentially, opposite each other, when one device (e.g., the NFET) is on and conducting (modeled simply as a closed switch), the other device (the PFET) is off, not conducting (ideally modeled as an open switch) and, vice versa. Thus, ideally, there is no static or DC current path in a typical CMOS circuit and ideal CMOS circuits use no static or DC power and only consume transient power from charging and discharging capacitive loads.

In practice, however, typical FETs are much more complex than switches. So, transient power for circuit loads (from switching currents) accounts for only a portion of CMOS chip power. Especially since device $V_T$ is directly proportional to gate dielectric thickness and also dependent on channel length, as FET features (including gate dielectric and channel length and thickness) shrink, current may continue to flow through off FETs causing what is known as subthreshold current. Subthreshold current is current conduction at gate biases below FET threshold and is directly proportional to gate width. Also, gate oxide leakage also became a major source static power loss. By replacing gate oxide with high-k dielectrics most of this gate oxide leakage has been eliminated.

However, polysilicon cannot be used with high-k dielectrics. Also, parasitic circuit resistances reduce performance and complicate design. A source of parasitic circuit resistances has been in the polysilicon used to form FET gates. Consequently, polysilicon is being replaced with wok function metal and aluminum in what is known as Replacement Metal Gate (RMG) FET technologies.

Further, reducing RMGFET lengths has degraded device transconductances (Gm/Gds) in addition to increasing subthreshold current. For a particular device, subthreshold current increases exponentially with the magnitude of the device's drain to source voltage ($V_{ds}$) and reduces exponentially with the magnitude of the device's $V_T$.

Subthreshold current is especially troublesome in achieving what is known as low $V_T$ devices, where the $V_T$ may be less than 100 millivolts (100 mV). Since these and other effects become more pronounced as the devices become shorter, they are commonly known collectively as short channel effects (SCEs). Metal gates in RMGFETS, even with high work function metals, have a lower work function than polysilicon. RMGFETs require lower channel doping levels or counter doping for low $V_T$ devices than equivalent polysilicon gate devices. So, low $V_T$ RMGFETs are much more susceptible to short channel effects than equivalent polysilicon gate devices and RMGPFETs are worse than RMGNFETs.

Consequently, especially for complex chips and arrays with a large number of devices, short channel effects can be overwhelming. When multiplied by the millions and even billions of devices on a state of the art IC, even 100 picoAmps (100 pA) of leakage in each of a million circuits, for example, results in chip leakage on the order of 100 milliAmps (100 mA).

Further, these short channel effects are much worse at operating conditions beyond nominal, e.g., higher supply voltages. However, frequently ICs require some devices to operate at higher voltages, e.g., in analog applications and in Input/Output (I/O) building blocks. For these applications devices with process normal (low $V_T$) but thicker than nominal gate dielectric are essential. Typically, to achieve low $V_T$s channel doping is selectively reduced or channels are selectively counter doped, either of which degrades device performance.

Thus, there exists a need in Integrated Circuits (ICs) for higher performance PFETs with reduced short channel effects; and more particularly, to reduce PFET $V_T$s and channel lengths in ICs without reduced/counter doping channels even while minimizing PFET short channel effects.

SUMMARY OF THE INVENTION

It is an aspect of the invention to reduce short channel effects in Integrated Circuits (ICs) without impairing performance;

It is another aspect of the invention to reduce PFET $V_T$s and channel lengths with minimal increase in PFET short channel effects;

It is yet another aspect of the invention to reduce short channel effects in low $V_T$, short channel IC PFETs while improving IC performance.

The present invention relates to Field Effect Transistors (FETs), Integrated Circuit (IC) chips including the FETs, and a method of forming the FETs on ICs. FET locations are defined on a layered semiconductor wafer, preferably a Silicon On Insulator (SOI) wafer. One or more FET locations are defined as silicon gate locations and remaining as Replacement Metal Gate (RMG) FET locations with at least one of each on the IC. Polysilicon gates are formed in all FET locations. Gates in silicon gate locations are tailored, e.g., doped and silicided. Remaining polysilicon gates are replaced with metal in RMG FET locations. FETs are connected together into circuits with RMG FETs being connected to silicon gate FETs.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
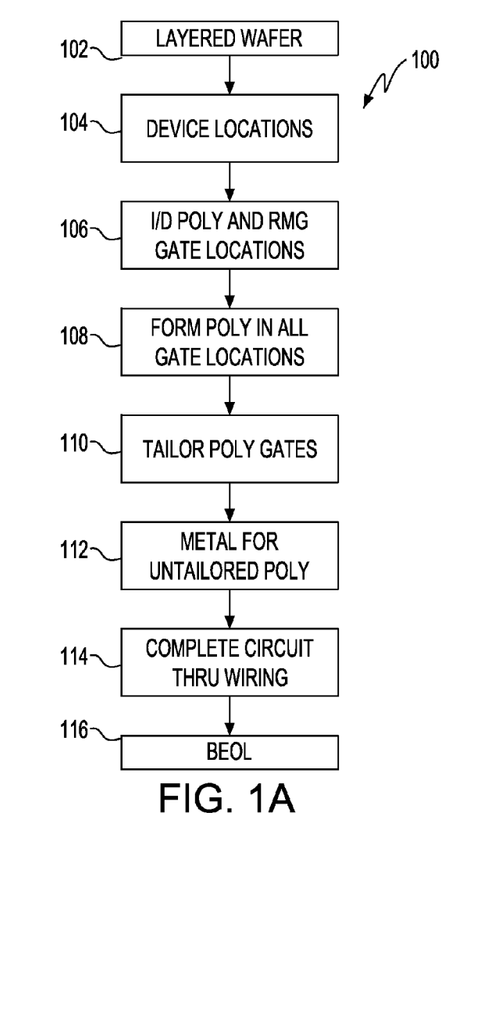
FIG. 1A shows examples of steps forming semiconductor devices, polysilicon gate Field Effect Transistors (FETs), especially P-type devices, in a Replacement Metal Gate (RMG) FET manufacturing process according to a preferred embodiment of the present invention.

Turning now to the drawings and, more particularly, FIG. 1A shows a first example of steps in a method 100 for forming semiconductor devices, polysilicon gate Field Effect Transistors (FETs), especially P-type devices, in a Replacement Metal Gate (RMG) FET manufacturing process according to a preferred embodiment of the present invention. Since in RMG nominal PFET devices are not band edged for the gate work function, for certain doping levels, RMGPFETs typically have higher threshold voltages (i.e., the magnitude of the $V_T$s) compared to corresponding polysilicon gate devices with the same doping profile and with the inversion layer thickness ($T_{inv}$) matched.

For a typical state of the art Silicon On Insulator (SOI) process, the PFET metal work function is targeted, best case, at about 100 millivolt (100 mV) from the band edge. Thus, by selectively using a polysilicon gate instead of metal, the same preferred polysilicon gate PFET may be a Super Low $V_T$ (SLVT). These preferred SLVT devices have threshold voltage that may on the order of 100 mv lower than the $V_T$ of RMGPFETs on the same chip and/or in the same circuit. While normally gate leakage is not a major concern for these preferred SLVT devices, gate oxide thickness may be tailored to trade gate leakage against $V_T$ and to offer devices suitable for analog applications.

IC fabrication begins 102 with a layered wafer and defining 104 device locations on the wafer. Locations may be defined by forming islands in the surface layer of the wafer. Some of the device locations are identified 106 for silicon gate devices. Silicon gates are formed with gate dielectric 108, wherein the silicon gates are the gates of the silicon gate devices and dummy gates for RMG devices. Silicon gate are tailored 110 electrically, e.g., doped and silicided. Dummy gates are replaced 112 with metal. Wiring is formed 114 connecting devices together into circuits and circuits together on chips. Finally, BEOL fabrication continues 116, completing chips.

Figure 1B:
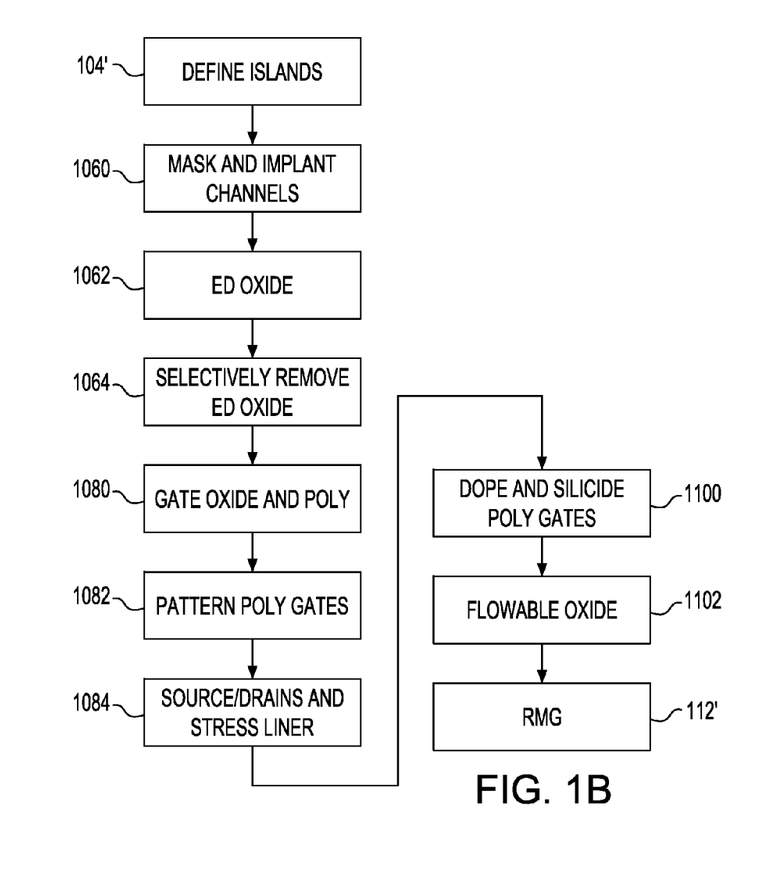

FIG. 1B shows another example of forming polysilicon gate FETs and RMGFETs as in FIG. 1A in more detail. First in 104', the surface layer of the layered wafer is segmented into islands, e.g., using shallow trench isolation (STI), each island identifying a location of one or more devices. If the IC is to include RMGPFETs or thicker oxide polysilicon gate FETs, an Extra gate Dielectric (ED oxide) layer is formed 1062 normally. The ED oxide is removed 1064 from the SLVT poly gate locations, e.g., using a suitable mask and etch. A gate oxide layer is formed 1080 on the wafer and a polysilicon layer is formed on the gate oxide layer. The polysilicon is patterned normally 1082, the wafer is implanted with a halo and extension implant and annealed, e.g., using a rapid thermal anneal (RTA). Spacers are formed along the patterned polysilicon sidewalls and source/drain regions are formed 1084. The polysilicon is exposed and implanted 1100 in silicon gate device locations. The polysilicon gates are silicided. The exposed silicided gates are covered 1102 with a dielectric, e.g., a flowable oxide. Remaining undoped poly is removed and replaced with metal 112'.

Figure 2A:
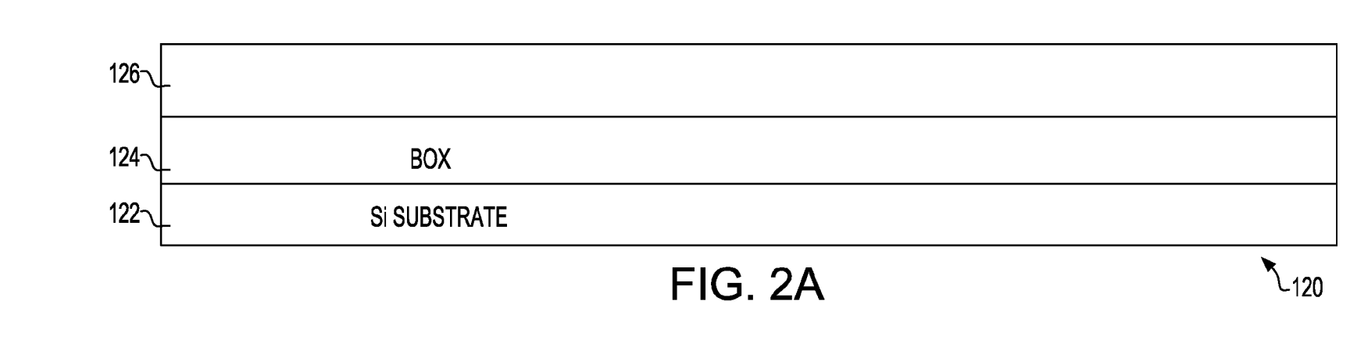
FIG. 2A-B shows a cross sectional example of a layered wafer, e.g., a Silicon On Insulator (SOI) wafer and device locations defined thereon according to a preferred embodiment of the present invention.
Figure 2B:
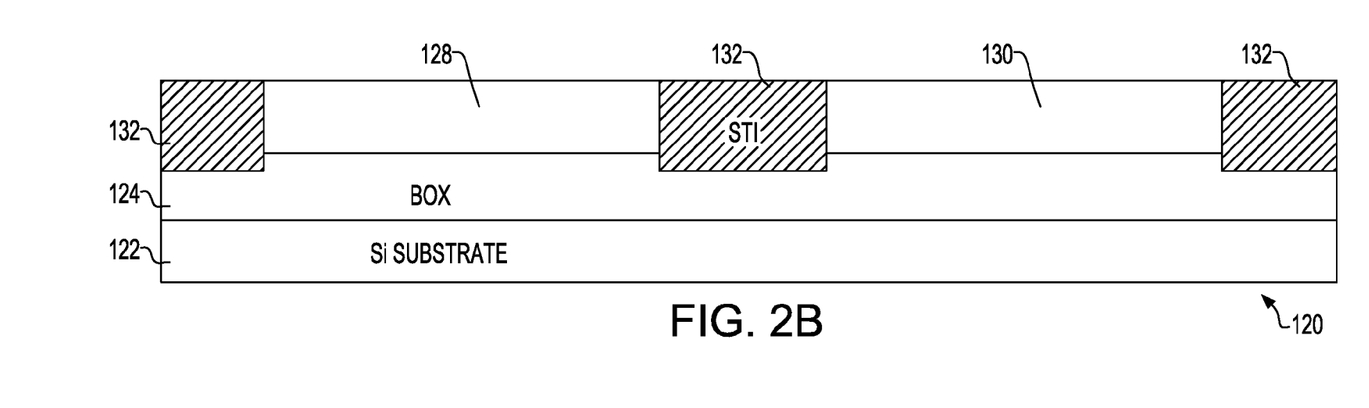

FIG. 2A-B shows a cross sectional example of a layered wafer 120, e.g., a SOI wafer (provided in 102 of FIG. 1A) and device locations defined 104 according to a preferred embodiment of the present invention. In this example, the layered wafer 120 includes a Silicon (Si) substrate 122, an insulator layer 124, e.g., Buried OXide (BOX), on the Si substrate 122, and a Si surface layer 126 on the BOX layer 124. The thicknesses of these layers 122, 124, 126 is process dependent and may be any thickness necessary for the selected SOI process.

Device formation begins (and 104' in FIG. 1B) by segmenting the surface layer 126, to define islands 128, 130 in FIG. 2B. Preferably, the islands 128, 130 are defined using a well-known STI technique, e.g., patterning and etching the layer 124 and filling between the islands with STI oxide 132. Although STI oxide 132 is shown in the Figures as being distinct from BOX layer 124, this is for example only. Typically, below the surface layer 126, the STI oxide merges with and is indistinguishable from the BOX layer 124. The segmented surface layer 126, which may have been previously body doped, is channel doped normally N or P-type, depending on the type of devices being formed, 106, 1060. Alternately body doping may be done prior to STI formation. In this example, both Islands are doped N-type for PFETs.

Next, an optional ED oxide layer (not shown) may be formed 1062 on the wafer 120. The ED oxide, if formed, is masked 1064 and removed from islands 128, 130 in exposed areas where thick oxide devices are not being formed. Preferably, the mask is removed with the exposed oxide in an integrated oxide and resist removal. A thin gate dielectric layer is formed 108, 1080 on the surface, e.g., a thermal oxide followed by nitridation. This gate dielectric acts as a dummy interfacial layer for RMG devices, e.g., formed on islands 128, and gate dielectric for preferred polysilicon gate devices on islands 130. Preferably, the gate dielectric is less than 1.5 nanometers (1.5 nm) thick, preferably 1.0 nm thick, and chosen such that $T_{inv}$ for the polysilicon devices, 1.3-1.5 nm, is matched to the RMG devices. A polysilicon layer less than 50 nm thick, preferably 25 nm thick, is deposited on the gate dielectric layer.

FIGS. 3A-D show an example of device formation through polysilicon device gate completion for P-type devices. First, the polysilicon layer and gate dielectric layer are patterned 1082, e.g., using a typical state of the art mask and etch technique, which defines polysilicon gates 134, 136 on dielectric 138, 140 in RMG device locations 142 and in preferred polysilicon gate device locations 144. The polysilicon gates 134 are, essentially sacrificial polysilicon gates and polysilicon gates 136 are gates of the preferred poly gate devices. The islands 128, 130 are implanted with a suitable halo and extension implant for the particular selected device type, P-type or N-type.

Figure 3A:
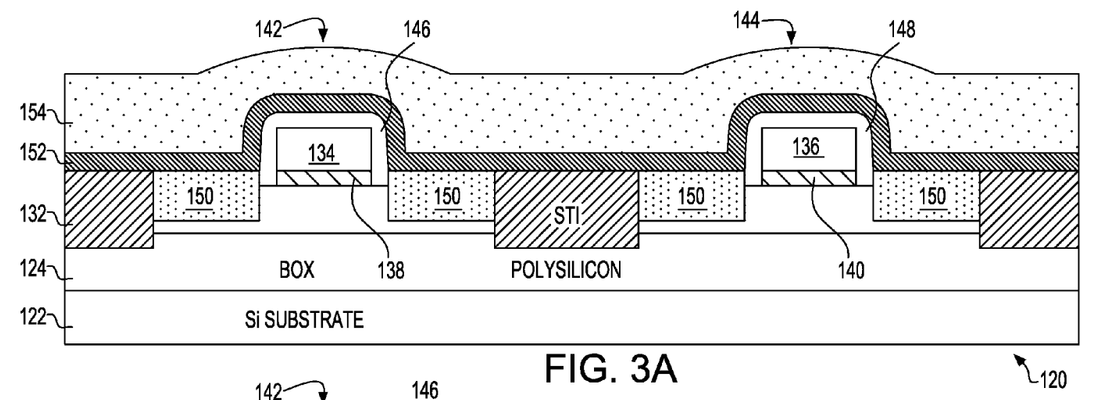
FIGS. 3A-D show an example of device formation through polysilicon device gate completion for preferred devices.

Next, a spacer dielectric (e.g., nitride) layer is conformally formed and patterned, e.g., using a suitable mask an etch techniques, leaving dielectric segments 146, 148 as gate sidewalls and covering the polysilicon gates 134, 136 to surface layer islands 128, 130. Then, the exposed portions of the surface layer islands 128, 130 are recessed 1084 and filled with a doped semiconductor, e.g., Silicon Germanium (SiGe), to form source/drain regions 150. A conformable stress layer 152 is formed on the wafer, e.g., a conformable nitride layer is deposited. Then, the wafer 120 is covered with a flowable dielectric layer 154, e.g., flowable oxide.

Figure 3B:
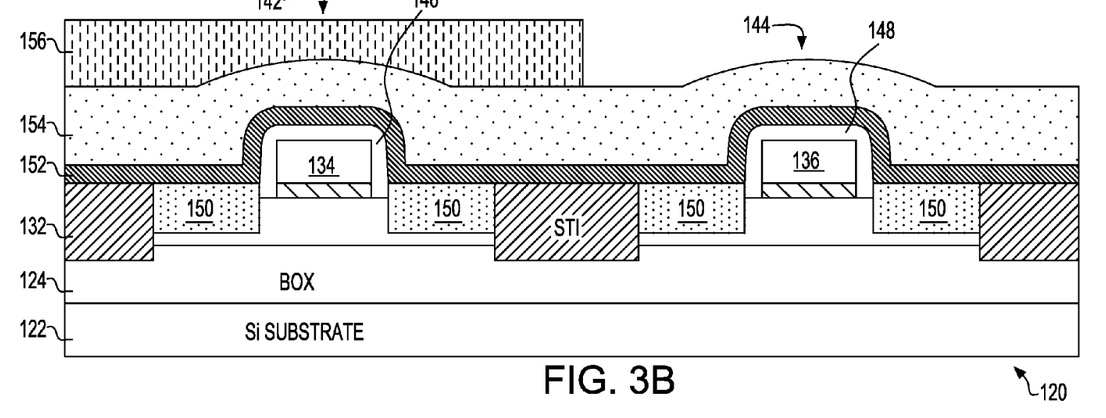

In FIG. 3B the wafer is masked 156 to protect areas where silicon gate devices are not being tailored, e.g., RMG FET islands 128. Then, in FIG. 3C the exposed silicon gate areas are etched 110, 1100 with a timed etch, e.g., using an anisotropic Reactive Ion Etch (RIE). The RIE removes the flowable oxide 154 to expose the nitride segment 148 on the polysilicon gate 136. A nitride RIE removes exposed horizontal portions of nitride segment 148 and exposes the gate 136 with only gate sidewalls 148' remaining along the polysilicon gates 136. The exposed polysilicon gates 136 are implanted, e.g., for a P-type FET with a $P^+$ implant.

Figure 3C:
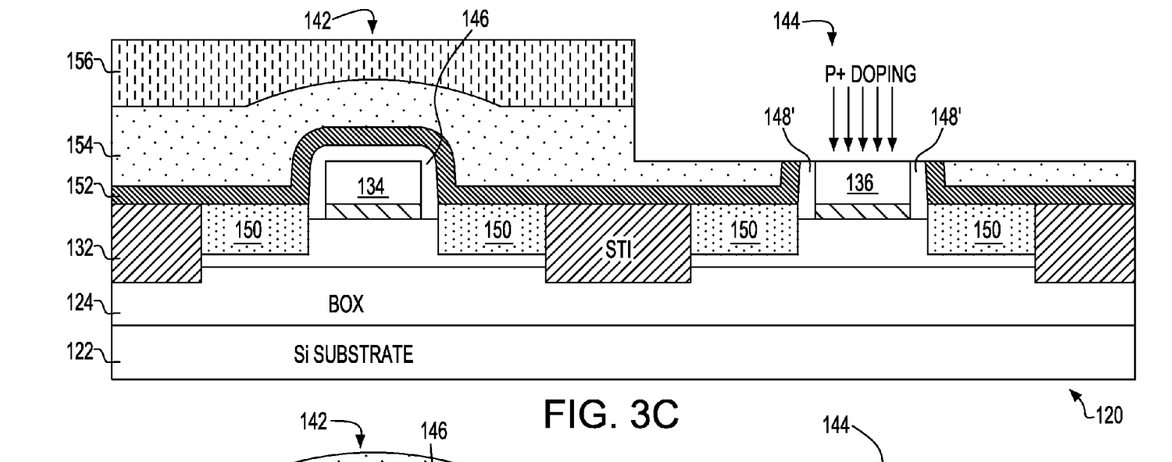
Figure 3D:
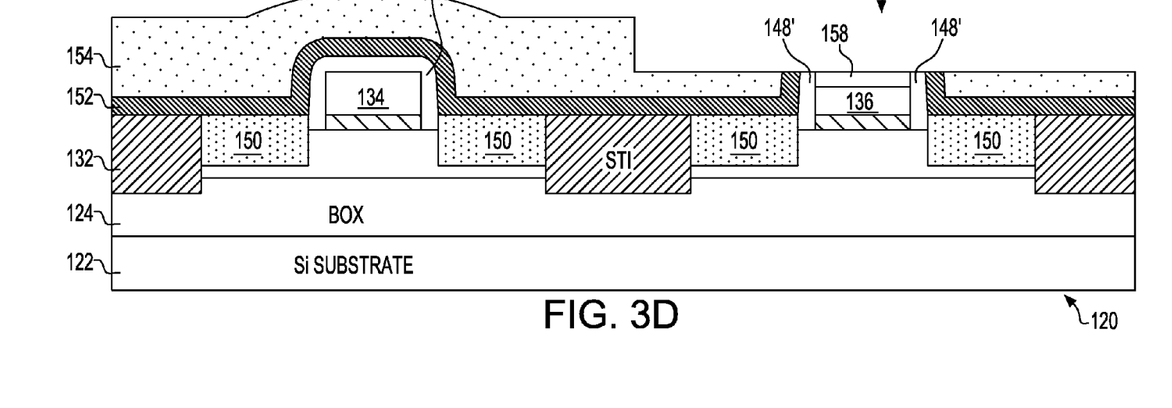

The mask is removed in FIG. 3D and the wafer 120 is annealed in a doping anneal. The wafer 120 is cleaned with a typical silicide pre-clean. Then, silicide 158 is formed on the polysilicon gate 136. The silicide 158 is preferably, Cobalt Silicide (CoSi), selected to withstand thermal requirements of subsequent RMG formation.

FIGS. 4A-D show a variation on the current example of FIGS. 3B and C, wherein chip NFETs and PFETs both include RMG and polysilicon gate devices with like features labeled identically, except P-type structure features are differentiated further by –p and N-type structure features are differentiated by –n. Further, while these figures show PFETs being treated first, followed by NFETs, this is for example only and not intended as a limitation. Devices may be treated together or NFETs may be treated first, as desired at the time of manufacture.

Figure 4A:
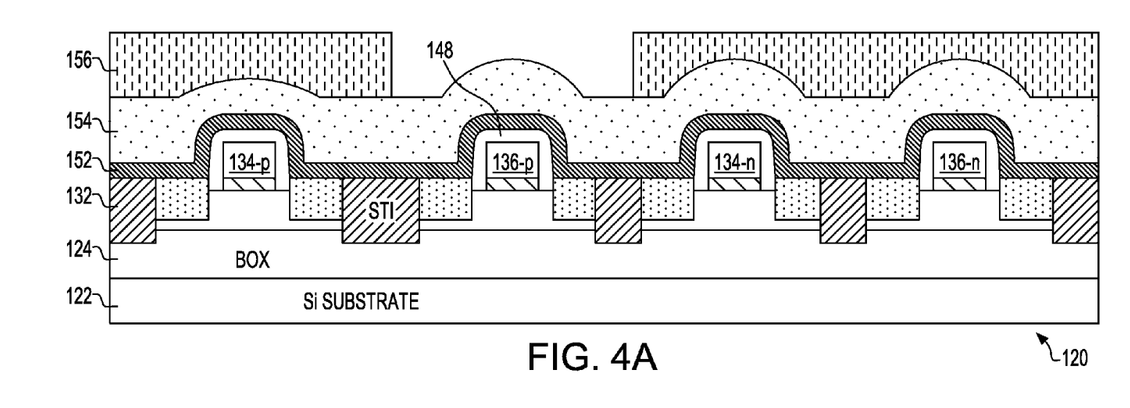
FIGS. 4A-D show a variation, wherein chip NFETs and PFETs both include RMG and polysilicon gate devices.
Figure 4B:
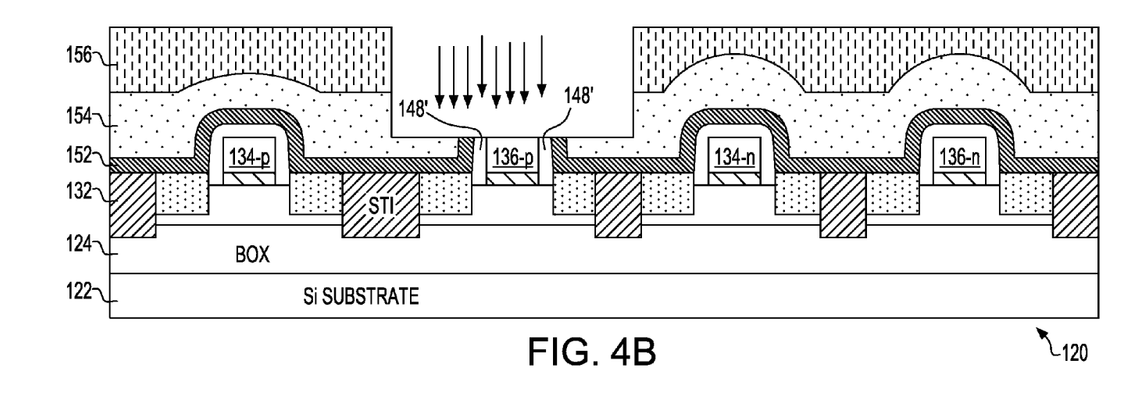
Figure 4C:
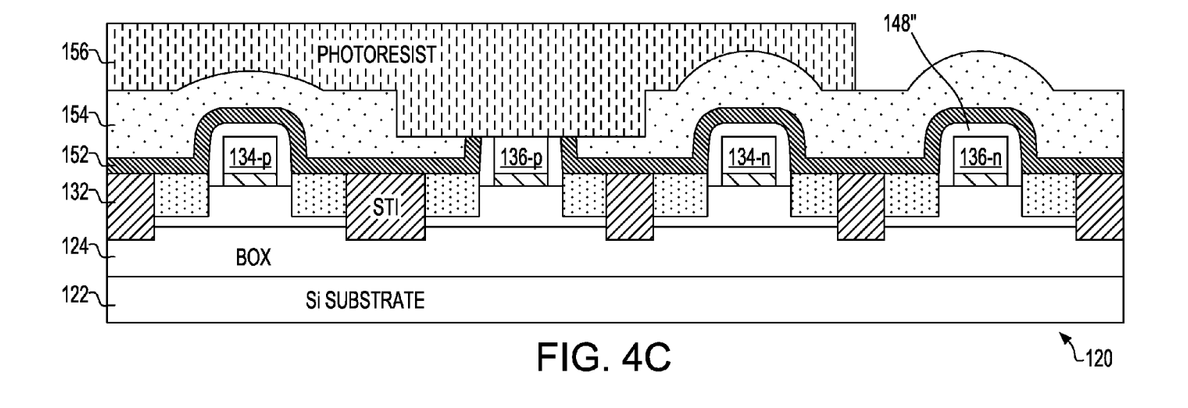
Figure 4D:
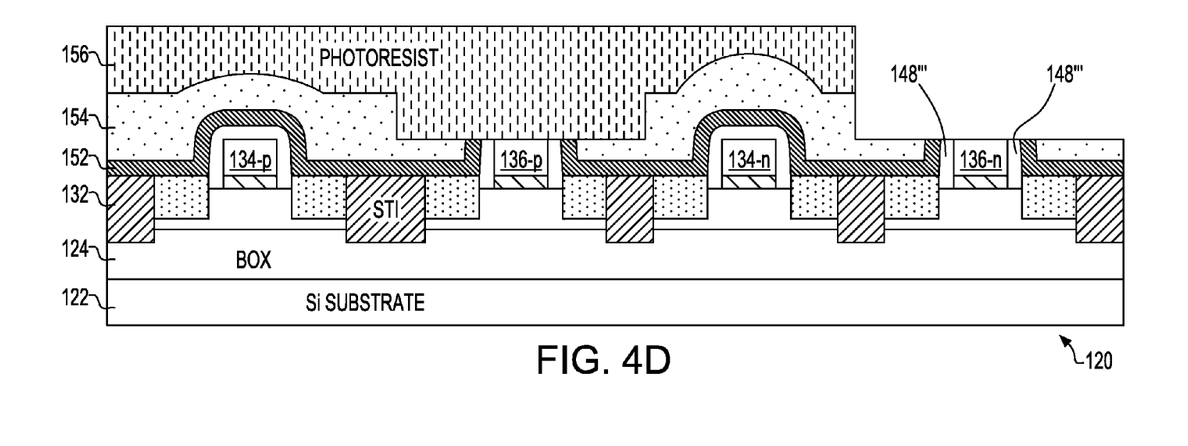

So, first in FIG. 4A as in FIG. 3B, the wafer is masked and only the polysilicon PFET gates 136-*p* are uncovered. As in FIG. 3C in FIG. 4B, a RIE removes the flowable oxide over the exposed flowable nitride layer 152 and exposes upper portions of segment 148 on the polysilicon gate 136-*p*. A nitride RIE removes exposed portions of segment 148 to expose the gate 136-*p*, which is implanted with a $P^+$ implant. In FIG. 4C as in FIGS. 4A and 3B, the wafer is masked and only the oxide above polysilicon NFET gates 136-*n* is uncovered. In FIG. 4D, a RIE removes the flowable oxide 154 to expose the flowable nitride layer 152 above segment 148" on the polysilicon gate 136-*n*. A nitride RIE removes the upper portion of the flowable nitride layer 152 and horizontal portions of segment 148" to expose the gate 136-*n* between sidewalls 148''', for implant with a $N^+$ implant.

Whether only PFET fabrication or both include polysilicon gates, fabrication continues in FIGS. 5A-D, which show an example of RMG device formation after polysilicon device gate 136 (or 136-*n* and -*p*) formation. First, the wafer 120 is re-covered 1102 with a flowable dielectric layer 154', e.g., flowable oxide. Then in FIG. 5B, the upper portions of the flowable dielectric layer, the flowable nitride layer 152' and the nitride segments 146 are removed 112, 112', preferably using a typical chemical-mechanical (chem-mech) polishing (CMP) technique to expose the sacrificial polysilicon gates 134. Preferably, the CMP is highly selective to dielectric materials and stops on the silicide 158. Since CMP is only used to expose the sacrificial gates 134, the silicon gate devices 144 are relatively immune to CMP induced variations. Thus, longer channel silicon gate devices, e.g., lengths several times longer than the typical device design length, are available for analog applications.

Figure 5A:
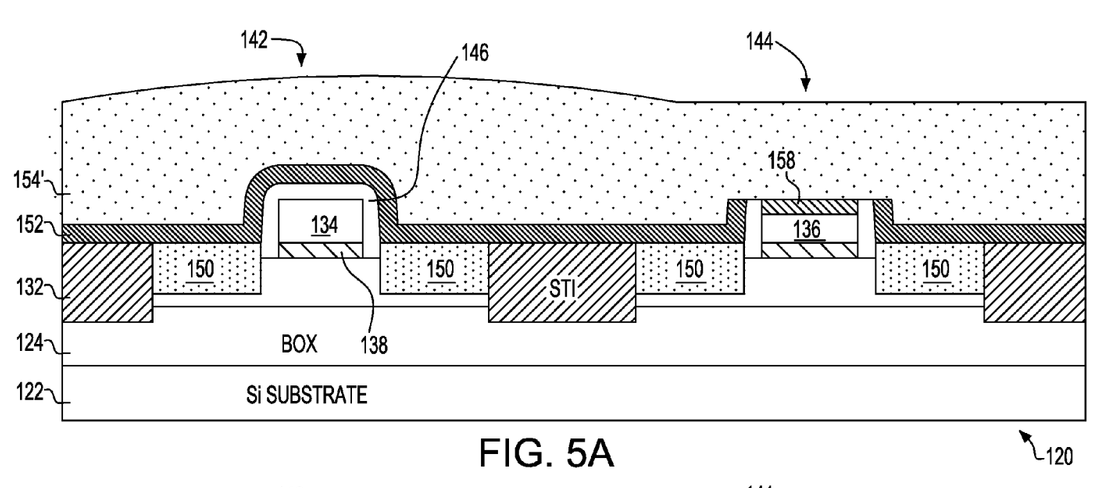
FIGS. 5A-D show an example of RMG device formation after polysilicon device gate formation.
Figure 5B:
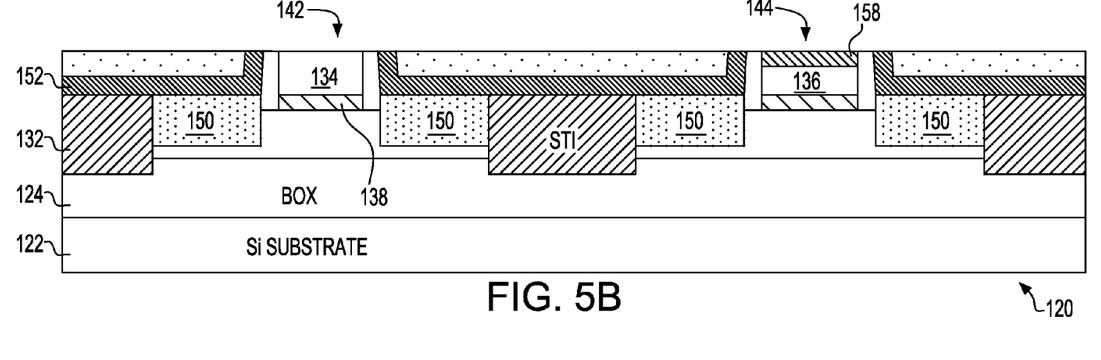
Figure 5C:
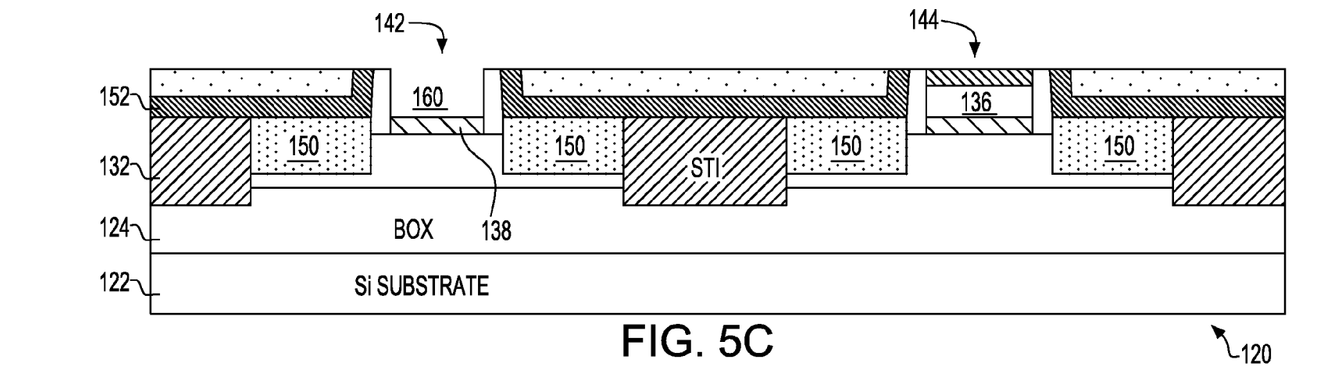

After removing the sacrificial polysilicon gates 128, preferably, using a selective wet etch, a partial void 160 forms in FIG. 5C. Then, the dielectric 138 is removed to complete the void 160. A high-k dielectric layer, preferably, 2 nm thick, is formed in the RMG gate location and lining the void 160. The high-k dielectric is removed from the surface, e.g. using CMP, to leave the voids lined with high-k dielectric layer 162. The high-k dielectric may be any suitable high-k dielectric material, conformally deposited, and removed using CMP. Preferably, the high-k dielectric material is Zirconium Oxide ($ZrO_5$) or hafnium dioxide ($HfO_2$).

Figure 5D:
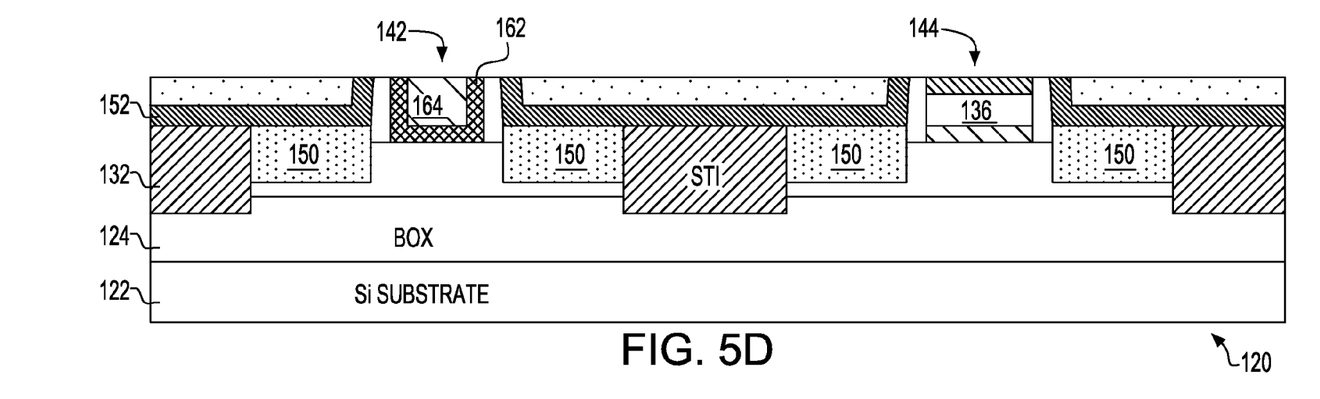

RMG gate formation is completed in FIG. 5D by filling the lined 162 RMG gate location with metal 164. The lined RMG gate location may be filled, for example, by forming a layer of work function metals, and preferably, a combination of metals such as Aluminum (Al), Titanium Nitride (TiNi), and/or Titanium Aluminum (TiAl). The work function metal layer is formed on the wafer surface using any suitable technique, followed by CMP. Alternately, the metal may be formed on the high-k dielectric layer 162 and a single CMP may be used to remove excess metal and high-k dielectric.

Figure 6:
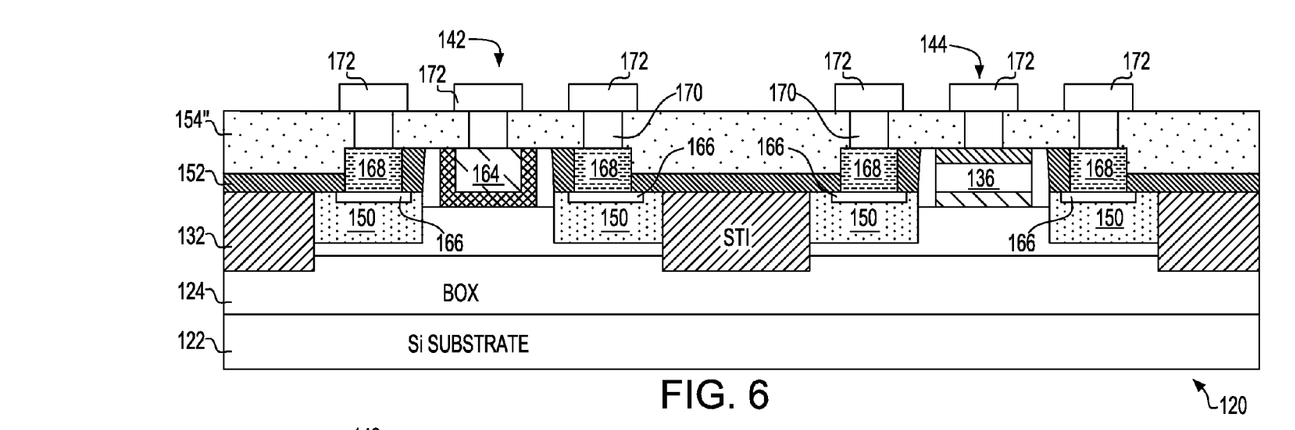
FIG. 6 show an example of normal chip wiring in preferred chips.

Thereafter, as shown in FIG. 6, processing continues normally 114. So, for example, silicide 166 is formed on device semiconductor surfaces, e.g., on SiGe source/drain regions 150. Contact pads 168 are formed through the remnant of dielectric 154' to the silicide 166. Then, dielectric layer 154" is re-formed on the wafer over the contact pads 168. Contacts 170 are formed through the dielectric layer 154" to underlying metal, e.g., metal gates 164, polysilicon gates 136 and contact pads 168. A metal wiring 172 layer is formed on the wafer. Optionally, the metal wires 172 and contacts 170 may be formed in a single step, e.g., using a typical dual damascene step. Wafer/chip fabrication continues 116 normally though typical BEOL steps.

Thus, the resulting ICs have both RMG and polysilicon gate devices on the same chip and even in the same circuits or functional logic blocks (e.g., Inverters. NAND gates and NOR gates). Moreover, the polysilicon gate PFETs may have lower $V_T$s than, and $T_{inv}$ matched to, any corresponding RMG PFETs.

Figure 7:
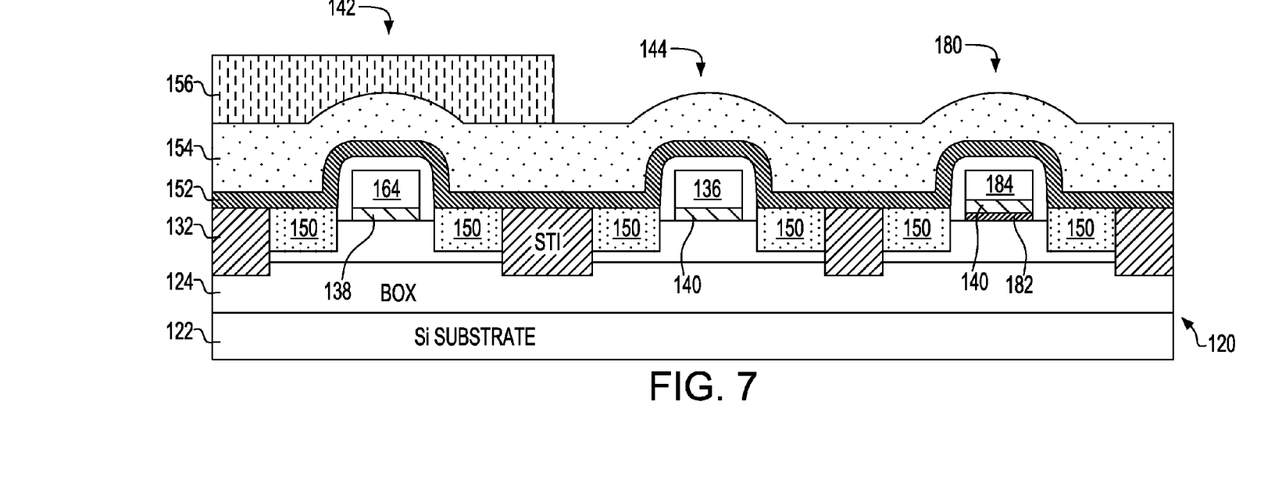
FIG. 7 shows an optional fabrication variation suitable for analog applications.

FIG. 7 shows an optional fabrication variation corresponding to FIG. 3B with identical features labeled identically, that may be suitable for analog applications or where low $V_T$ devices with thicker oxide are needed. In this optional embodiment, thicker gate dielectric devices 180 may be formed on the same chips with relatively minor fabrication adjustments, depositing ED oxide 182 and selectively removing it. The polysilicon 184 in the thicker gate dielectric (ED) devices, or EDPFETs 180, is processed substantially identically to the polysilicon gates 136, as shown in FIGS. 3C and D, 5A-D and 6. This allows for longer channel polysilicon devices, that could not otherwise be included in RMGFET circuits. Moreover, these EDPFETs are relatively more immune to CMP variations.

Figure 8A:
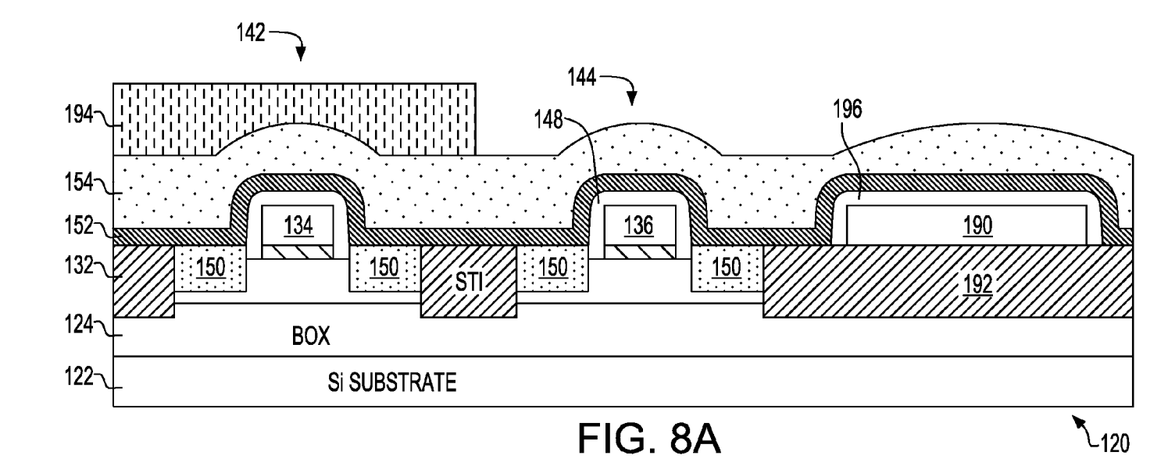
FIGS. 8A-8C show forming fuses or resistors with the polysilicon gate and RMG devices.
Figure 8B:
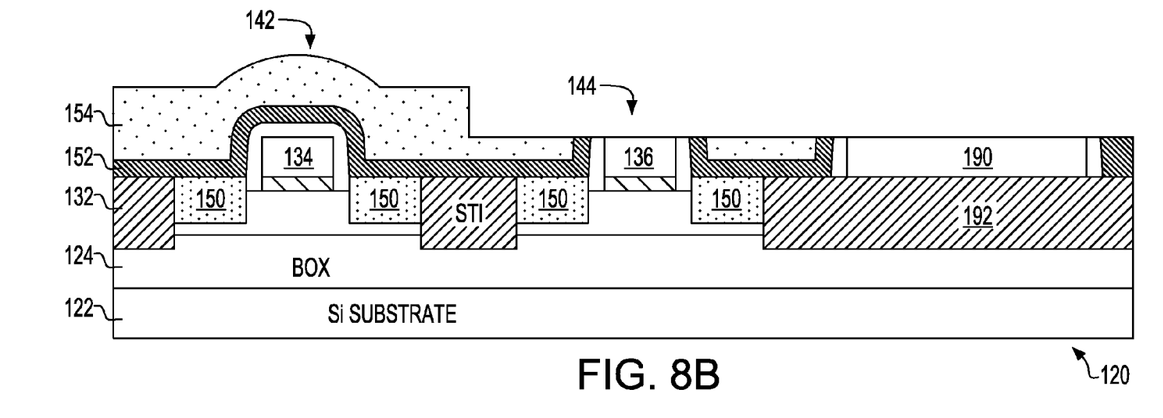
Figure 8C:
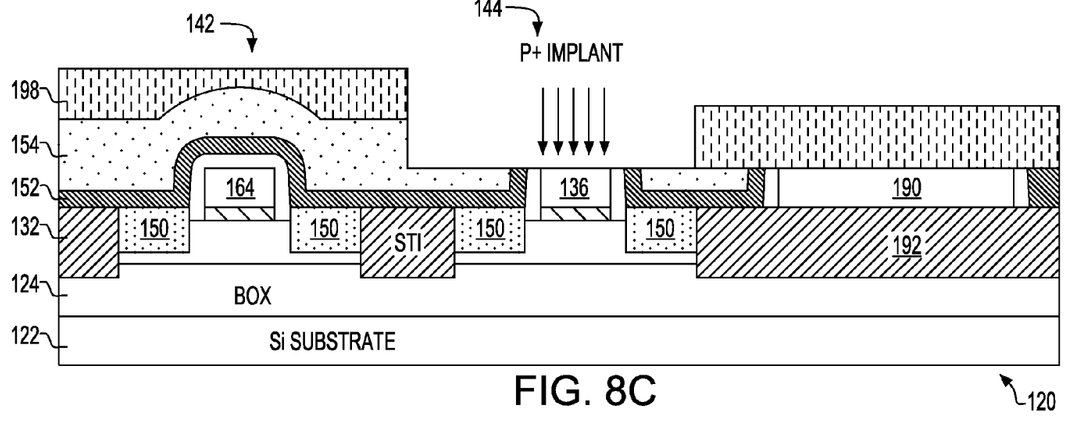

Optionally, fuses 190 also may be formed on STI 192 with the polysilicon gates 136, beginning as shown in FIGS. 8A-8C, which correspond to FIGS. 3B and 3C with identical features labeled identically. First in FIG. 8A as in FIG. 3B, the wafer is masked 194 and the polysilicon segment(s) 190 is(are) uncovered with polysilicon PFET gates 136. A RIE removes the flowable oxide 154 and flowable nitride 146 over, and exposes the horizontal surfaces of, nitride segments 148 and 196. A nitride RIE removes the exposed horizontal surfaces of nitride segments 148 and 196 in FIG. 8B. Removing horizontal surfaces of nitride segments 148 and 196 exposes the gates 136 and polysilicon segment(s) 190. Then, the mask 194, e.g., a photoresist, is removed normally.

Next, the polysilicon PFET gates 136 are implanted in FIG. 8C, substantially as in FIG. 3B. So prior to implant, the wafer is masked 198 again and only the polysilicon PFET gates 136 are left unmasked. A RIE removes the flowable oxide 152 over the polysilicon gate 136 to expose flowable nitride layer 150 above nitride segment 146. A nitride RIE removes horizontal portions of nitride layers 150, 146 and exposes the gate 136, which is implanted with a P$^+$ implant.

The mask 198 is removed in FIG. 8C and the wafer 120 is annealed in a doping anneal. The wafer 120 is cleaned with a typical silicide pre-clean. Then, silicide 158, 200 is formed on the polysilicon gates 136 and fuse segments 190. Preferably, the silicide 158, 200 is CoSi.

Figure 9:
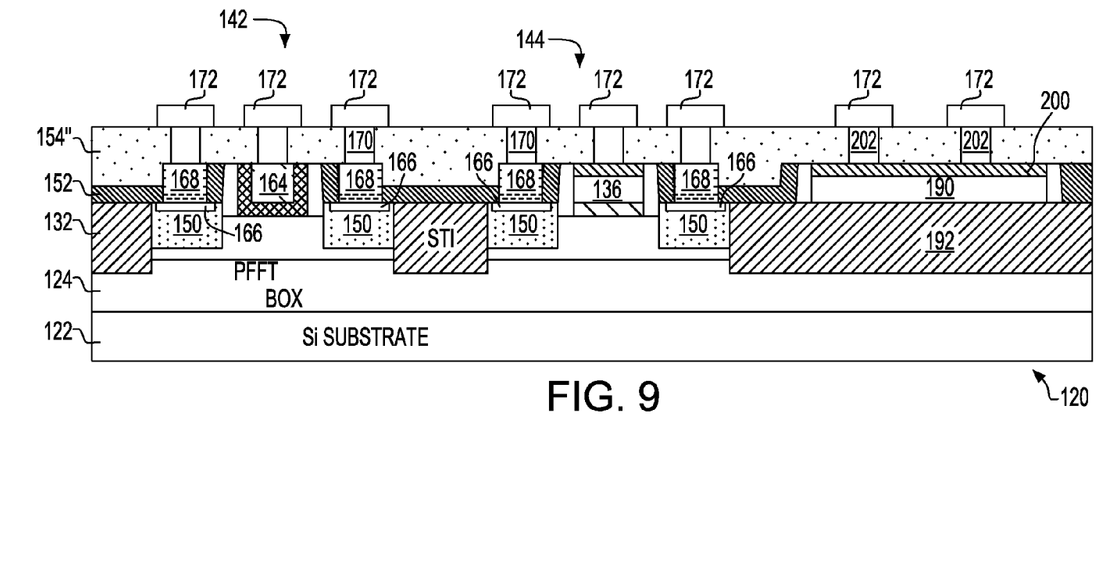
FIG. 9 show an example of normal chip wiring to fuses and devices in preferred chips.

Thereafter, as shown in FIG. 9, processing continues normally, substantially as described for FIG. 6. So again, silicide 158 is formed on device semiconductor surfaces, e.g., on SiGe source/drain regions 150. Contact pads 168 are formed through the remnant of dielectric 154' to the silicide 166. Then, dielectric layer 154" is re-formed on the wafer over the contact pads 168. Contacts 170, 202 are formed through the dielectric layer 154" to underlying metal, e.g., metal gates 164, polysilicon gates 136 and contact pads 168 and fuses 190. Metal wiring 172 layer is formed on the wafer. Optionally, the metal wires 172 and contacts 170, 202 again may be formed in a single, e.g., a dual damascene step. Wafer/chip fabrication continues normally though typical back end of the line (BEOL) steps.

Figure 10:
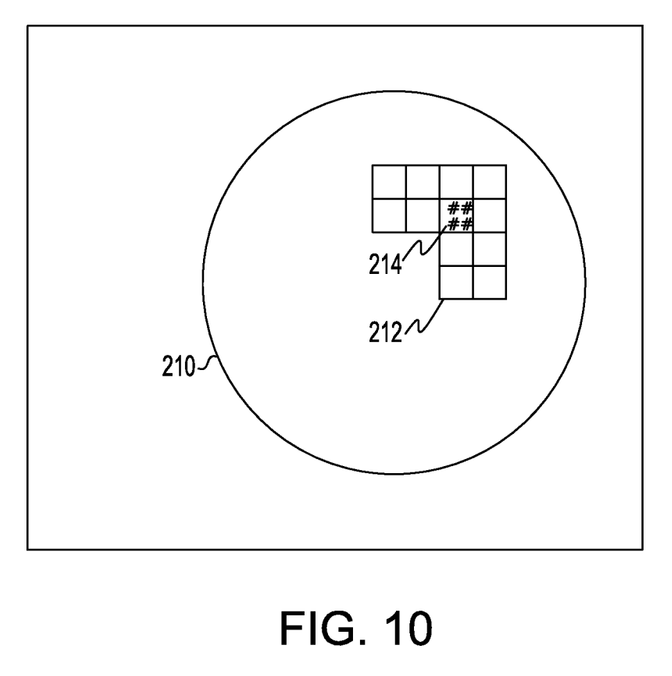
FIG. 10 shows an example of a wafer with chips manufactured according to a preferred embodiment of the present invention.

FIG. 10 shows an example of a wafer 210 with chips 212 manufactured according to a preferred embodiment of the present invention. The chips include connected circuits 214, one or more of which includes preferred FETs.

Thus advantageously, silicon gate PFETs (and silicon eFuses) may be mixed selectively with metal gate devices on RMGFET ICs to provide low $V_T$ PFETs without compromising short channel effects and without adding significant manufacturing costs. Manufacturing costs increase only slightly because the present invention uses what was previously disposable, sacrificial polysilicon shapes in a process that adds only low critical manufacturing steps, i.e., mask and etch steps to remove dielectric layers and an implant and silicide to tailor the polysilicon gates. Moreover, this may be extended to form thicker gate dielectric PFETs by selectively forming thick oxide, and to NFETs as well with the addition of a single implant mask. These thicker dielectric, low $V_T$ devices have analog applications and are very useful for achieving high dynamic ranges for analog/radio frequency (RF) circuits.

In addition, preferred low $V_T$ devices are produced without degrading device transconductances (Gm/Gds), otherwise apparent in a low $V_T$ devices realized using lower channel doping or compensation doping. Neither do preferred low $V_T$ devices suffer from body resistance ($R_{body}$) penalties which is also advantageous for high frequency analog devices.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming Field Effect Transistors (FETs), said method comprising:
   defining FET locations on a layered semiconductor wafer, said layered semiconductor wafer having semiconductor gate dielectric formed on a surface semiconductor layer, semiconductor gates being formed in all FET locations;
   identifying semiconductor gate locations, at least one FET location being identified as a semiconductor gate location, remaining FET locations being metal gate locations, a plurality of said FET locations being first type FET locations with said semiconductor gate dielectric having a selected thickness, said plurality of said FET locations including at least one metal gate location and at least one semiconductor gate location;
   replacing semiconductor gates with metal in said metal gate locations, wherein at least one semiconductor gate FET of said first type has a lower threshold than metal gate FETs of said first type, the metal gate work function being 100 millivolts (100 mV) or more from the band edge of said surface semiconductor layer, said lower threshold voltage ($V_T$) being 100 mV lower in magnitude than metal gate FET $V_T$s of the same device type; and
   connecting FETs together, metal gate FETs being connected to semiconductor gate FETs.

2. A method of forming FETs as in claim 1, wherein said layered semiconductor wafer is a Silicon On Insulator (SOI) wafer, said semiconductor gates are polysilicon gates, and defining FET locations comprises:
   segmenting the surface silicon layer of said SOI wafer, silicon islands being defined from said surface silicon layer;
   doping said silicon islands, at least one being doped for said first type FETs;
   forming a gate dielectric layer on said SOI wafer;
   forming a polysilicon layer on said gate dielectric layer; and
   patterning said polysilicon layer and said dielectric layer to define gates, polysilicon gates remaining at said FET locations.

3. A method of forming FETs as in claim 2, wherein after doping said silicon islands an Extra gate Dielectric (ED)

oxide layer is formed on one or more said silicon islands and selectively removed, said ED oxide layer remaining on at least one other identified said polysilicon gate location, said at least one other being a polysilicon EDFET location.

4. A method of forming FETs as in claim 2, wherein replacing one or more polysilicon gates with metal gates comprises:
 exposing an upper surface of untailored said polysilicon gates;
 removing exposed polysilicon, a void being formed by the removal; and
 filling said void with metal.

5. A method of forming FETs as in claim 2, wherein identifying polysilicon gate locations comprises tailoring identified polysilicon gates, tailoring said identified polysilicon gates comprising:
 exposing an upper surface of said identified polysilicon gates;
 doping exposed said identified polysilicon gates; and
 forming a silicide layer on said exposed surface.

6. A method of forming FETs as in claim 5, wherein said same first type is P-type, and Cobalt (Co) silicide is formed on said surface, metal gate PFETs having a 100 mV nominal $V_T$.

7. A method of forming FETs as in claim 2, wherein shallow trench isolation (STI) segments said surface silicon layer, said method further comprising:
 defining at least one polysilicon fuse base on STI oxide;
 exposing an upper surface of each said polysilicon fuse base; and
 forming a silicide layer on said exposed surface.

8. A method of forming Integrated Circuit (IC) chips, said method comprising:
 segmenting a surface silicon layer of a Silicon On Insulator (SOI) wafer into silicon islands to define Field Effect Transistor (FET) locations, a plurality of FET locations being a first conduction type;
 forming a silicon gate dielectric layer on said silicon semiconductor layer;
 forming polysilicon gates on the silicon gate dielectric layer in all FET locations;
 identifying one or more FET locations as silicon gate FET locations, remaining FET locations being identified as Replacement Metal Gate (RMG) FET locations, at least one RMG FET location and at least one silicon gate FET location being said first conduction type and having silicon gate dielectric with a selected thickness;
 replacing polysilicon gates with metal in all of said RMG FET locations, wherein RMG FETs of said first conduction type have a higher threshold voltage ($V_T$) than said at least one silicon gate FET location FETs of said first conduction, wherein the metal gate work function is 100 millivolt (100 mV) or more from the band edge of said surface silicon layer and said at least one silicon gate FET location FETs have a $V_T$ that is 100 mV in magnitude lower than RMG FET $V_T$s of the same conduction type; and
 connecting FETs together, RMG FETs being connected to silicon gate FETs.

9. A method of forming ICs as in claim 8, wherein identifying silicon gate FET locations comprises tailoring polysilicon gates in said silicon gate FET locations comprising:
 exposing an upper surface of selected said polysilicon gates;
 doping exposed said selected polysilicon gates; and
 forming a silicide layer on said exposed surface, said silicided polysilicon gates being silicon gate FET gates.

10. A method of forming ICs as in claim 9, wherein said first conduction type is P-type and Cobalt (Co) silicide is formed on said surface, metal gate PFETs having a 100 mV nominal $V_T$.

11. A method of forming ICs as in claim 9, wherein before forming said silicon gate dielectric layer, said method further comprises:
 doping said silicon islands;
 forming an Extra gate Dielectric (ED) oxide layer on said SOI wafer; and
 selectively removing oxide from said ED oxide layer at one or more said silicon islands, wherein after selectively removing said oxide, said ED oxide layer remains on at least one said polysilicon gate FET silicon island, said at least one being a polysilicon EDFET location.

12. A method of forming ICs as in claim 8, wherein replacing one or more polysilicon gates with metal gates comprises:
 exposing an upper surface of said polysilicon gates in RMG locations;
 removing exposed polysilicon, a void being formed by the removal;
 removing exposed sidewalls and silicon gate dielectric oxide layer from said void;
 lining said void with high-k dielectric; and
 filling said void with metal.

13. A method of forming ICs as in claim 8, wherein shallow trench isolation (STI) is used to segment said surface layer, said method further comprising:
 defining at least one polysilicon fuse base on STI oxide;
 exposing an upper surface of each said polysilicon fuse base; and
 forming a silicide layer on said exposed surface.

14. A method of forming CMOS Integrated Circuit (IC) chips, said method comprising:
 segmenting a surface silicon layer of a Silicon On Insulator (SOI) wafer into silicon islands to define Field Effect Transistor (FET) locations;
 forming silicon gate dielectric on said silicon semiconductor layer;
 forming polysilicon gates in all FET locations;
 identifying one or more FET locations as silicon gate FET locations, remaining FET locations being identified as Replacement Metal Gate (RMG) FET locations, at least one RMG FET location and at least one silicon gate FET location being said P-type FET (PFET) locations and having silicon gate dielectric with a selected thickness;
 replacing polysilicon gates with metal in all of said RMG FET locations, wherein the metal gate work function is 100 millivolt (100 mV) or more from the band edge of said surface silicon layer and one or more PFETs is a Super Low $V_T$ (SLVT) PFET, SLVT PFETs being silicon gate PFETs with a threshold voltage ($V_T$) 100 mV in magnitude lower than RMG PFETs $V_T$s; and
 connecting FETs together, RMG FETs being connected to silicon gate FETs.

15. A method of forming CMOS ICs as in claim 14, wherein identifying silicon gate FET locations comprises tailoring polysilicon gates in said silicon gate FET locations comprising:
 exposing an upper surface of selected said polysilicon gates;
 doping exposed said selected polysilicon gates; and
 forming a silicide layer on said exposed surface, said silicided polysilicon gates being silicon gate FET gates.

16. A method of forming CMOS ICs as in claim 15, wherein Cobalt (Co) silicide is formed on said surface and metal gate PFETs have a nominal $V_T$ of 100 mV.

17. A method of forming CMOS ICs as in claim 16, wherein before forming silicon gate dielectric, said method further comprises:
- doping NFET said silicon islands P-type and PFET said silicon islands N-type;
- forming an Extra gate Dielectric (ED) oxide layer on said SOI wafer; and
- selectively removing said ED oxide layer at one or more said silicon islands identified as RMG and SLVT FET locations, wherein after selectively removing said dielectric layer at RMG and SLVT FET islands, said ED oxide layer remains on at least one said polysilicon gate FET silicon island, said at least one being a polysilicon EDFET location.

18. A method of forming CMOS ICs as in claim 16, wherein replacing one or more polysilicon gates with metal gates comprises:
- exposing an upper surface of said polysilicon gates in RMG locations;
- removing exposed polysilicon, a void being formed by the removal;
- removing exposed sidewalls and silicon gate dielectric from said void;
- lining said void with high-k dielectric; and
- filling said void with metal.

19. A method of forming CMOS ICs as in claim 16, wherein shallow trench isolation (STI) is used to segment said surface layer, said method further comprising:
- defining at least one polysilicon fuse base on STI oxide;
- exposing an upper surface of each said polysilicon fuse base; and
- forming a silicide layer on said exposed surface.

* * * * *